(12) United States Patent
Iwazaki

(10) Patent No.: US 8,071,980 B2
(45) Date of Patent: Dec. 6, 2011

(54) RADIATION DETECTOR

(75) Inventor: Nobuyuki Iwazaki, Minami-Ashigara (JP)

(73) Assignee: FUJIFILM Corporation, Tokyo (JP)

( * ) Notice: Subject to any disclaimer, the term of this patent is extended or adjusted under 35 U.S.C. 154(b) by 372 days.

(21) Appl. No.: 12/022,503

(22) Filed: Jan. 30, 2008

(65) Prior Publication Data
US 2008/0237770 A1   Oct. 2, 2008

(30) Foreign Application Priority Data
Mar. 30, 2007 (JP) ................................ 2007-094273

(51) Int. Cl.
*H01L 29/04* (2006.01)
(52) U.S. Cl. ......... 257/59; 257/72; 257/347; 257/433; 257/E27.132; 257/E27.131; 250/265; 250/267; 349/42; 349/152; 349/138
(58) Field of Classification Search .......... 257/347, 257/350–351, 433, 787, E27.132, E27.131; 349/42, 43, 138, 149, 152, 153, 168; 250/265, 250/267
See application file for complete search history.

(56) References Cited

U.S. PATENT DOCUMENTS

| | | | |
|---|---|---|---|
| 5,449,908 A * | 9/1995 | Wadsworth et al. | 250/332 |
| 5,563,421 A | 10/1996 | Lee et al. | |
| 6,710,378 B1 * | 3/2004 | Makiuchi et al. | 257/184 |
| 6,885,005 B2 * | 4/2005 | Sato et al. | 250/370.01 |
| 7,105,829 B2 * | 9/2006 | Sato et al. | 250/370.09 |
| 7,112,776 B2 | 9/2006 | Iwakiri | |
| 7,112,800 B2 | 9/2006 | Sato et al. | |
| 7,233,021 B2 * | 6/2007 | Izumi | 257/59 |
| 2002/0017612 A1 * | 2/2002 | Yu et al. | 250/370.11 |
| 2002/0148949 A1 * | 10/2002 | Sato et al. | 250/214.1 |
| 2003/0002625 A1 * | 1/2003 | Suzuki | 378/98.8 |
| 2003/0015665 A1 * | 1/2003 | Suzuki et al. | 250/370.11 |
| 2003/0183749 A1 * | 10/2003 | Tsutsui et al. | 250/214.1 |

(Continued)

FOREIGN PATENT DOCUMENTS
JP   09-009153 A   1/1997
(Continued)

OTHER PUBLICATIONS

Notice of Reasons for Rejection, dated Sep. 27, 2011, issue in corresponding JP Application No. 2007-094273, 4 pages in English and Japanese.

*Primary Examiner* — William D Coleman
*Assistant Examiner* — Su Kim
(74) *Attorney, Agent, or Firm* — Sughrue Mion, PLLC

(57) ABSTRACT

A radiation detector that includes a charge conversion layer, a substrate, an electrode layer, an intermediary layer and wiring is provided. The substrate includes a lower electrode portion that collects charge generated by the charge conversion layer. The electrode layer includes an upper electrode portion and an extended electrode portion. The upper electrode portion is laminated on the charge conversion layer. The extended electrode portion extends from the upper electrode portion down a side face of the charge conversion layer to a region on the substrate at which the charge conversion layer is not present. The intermediary layer is formed from between the charge conversion layer and the upper electrode portion to between the extended electrode portion and the substrate. The wiring is electrically connected with the extended electrode portion at the region on the substrate at which the charge conversion layer is not present.

6 Claims, 9 Drawing Sheets

U.S. PATENT DOCUMENTS

| | | |
|---|---|---|
| 2005/0051731 A1* | 3/2005 | Sato et al. .............. 250/370.01 |
| 2006/0033031 A1 | 2/2006 | Takeda et al. |
| 2008/0237770 A1 | 10/2008 | Iwazaki |
| 2009/0026381 A1 | 1/2009 | Iwazaki |

FOREIGN PATENT DOCUMENTS

| | | |
|---|---|---|
| JP | 11-211837 A | 8/1999 |
| JP | 11-224975 A | 8/1999 |
| JP | 2000-241556 A | 9/2000 |
| JP | 2002-303676 A | 10/2002 |
| JP | 2005-086059 A | 3/2005 |
| JP | 2005-101193 A | 4/2005 |
| JP | 2005-286183 A | 10/2005 |
| WO | 00/23820 A1 | 4/2000 |

* cited by examiner

RADIATION DETECTOR

CROSS-REFERENCE TO RELATED APPLICATION

This application claims priority under 35 USC 119 from Japanese Patent Application No. 2007-094273, the disclosure of which is incorporated by reference herein.

BACKGROUND OF THE INVENTION

1. Field of the Invention

The present invention relates to a radiation detector to be used in a clinical X-ray photography device or the like.

2. Description of the Related Art

The following radiation detectors are known: indirect conversion-type radiation detectors that first convert radiation such as X-rays or the like to light and then further convert the converted light to electronic signals by opto-electronic conversion; and direct conversion-type radiation detectors in which incident radiation is directly converted to electronic signals by a charge conversion layer.

As a direct conversion-type radiation detector, radiation detectors disclosed in Japanese Patent Application Laid-Open (JP-A) Nos. 2005-86059 and 2005-286183 are widely known. In a radiation detector of JP-A No. 2005-86059 or JP-A No. 2005-286183, a high voltage line is connected to an upper electrode portion on a charge conversion layer, which is amorphous selenium. Consequently, depending on conditions at a time of connection during manufacture and at subsequent times of usage and the like, the high voltage line compresses the amorphous selenium. Crystallization of the amorphous selenium is induced by this pressure and the amorphous selenium degrades, and radiation detection accuracy falls.

Alternatively, in a structure in which a connection between the high voltage line and the upper electrode portion is formed not on the charge conversion layer but at a region in which there is no charge conversion layer on a glass substrate, the glass substrate and the upper electrode portion are joined together. Therefore, high adhesion between the glass substrate and the upper electrode portion is required, and thus materials to be used for the upper electrode portion are limited.

In contrast, as illustrated in JP-A No. 2000-241556, a structure is known in which the upper electrode portion is formed on the charge conversion layer and is led along a side face of the charge conversion layer down to the glass substrate, and the high voltage line, which is introduced from a panel exterior portion, is connected with the upper electrode portion at a connection pad which is formed on the glass substrate using a conductive material, such as an ITO film.

However, with the structure illustrated in JP-A No. 2000-241556, it is necessary to form an ITO film or the like on the glass substrate beforehand. In such a case, a structure is formed in which a portion of the conductive connection pad is under the charge conversion layer. As a result, there is a possibility that creeping discharges to pixel electrodes, which are a lower electrode portion provided under the charge conversion layer, may occur.

SUMMARY OF THE INVENTION

In consideration of the circumstances described above, an object of the present invention is to provide a radiation detector which both suppresses degradation of a charge conversion layer and can assure insulation with respect to a lower electrode portion provided under the charge conversion layer.

A radiation detector of the present invention includes: a charge conversion layer that generates charge consequent to radiation being incident in a state in which a bias voltage is applied; a substrate provided below the charge conversion layer, the substrate including a lower electrode portion that collects charge generated by the charge conversion layer; an electrode layer including an upper electrode portion that is laminated on the charge conversion layer and is for applying the bias voltage to the charge conversion layer, and an extended electrode portion that extends from the upper electrode portion down a side face of the charge conversion layer to a region on the substrate at which the charge conversion layer is not present; an intermediary layer disposed from between the charge conversion layer and the upper electrode portion to between the extended electrode portion and the substrate, the intermediary layer raising joining force between the extended electrode portion and the substrate; and wiring that is electrically connected with the extended electrode portion at the region on the substrate at which the charge conversion layer is not present, and that applies the bias voltage through the extended electrode portion to the charge conversion layer via the upper electrode portion.

According to this structure, the extended electrode portion extends from the upper electrode portion, down the side face of the charge conversion layer, to the region at which the charge conversion layer is not present on the substrate. A charge conversion layer bias voltage is applied, by the wiring which is electrically connected to the extended electrode portion, through the extended electrode portion to the charge conversion layer via the upper electrode portion. In the state in which the bias voltage is applied, the charge conversion layer generates charge when radiation is incident thereon. The charge generated by the charge conversion layer is collected by the lower electrode portion.

In the structure of the present invention, the extended electrode portion is electrically connected with the wiring at a region on the substrate at which the charge conversion layer is not present. Thus, in comparison with a structure in which a connection with wiring is formed on the charge conversion layer, pressure that is applied to the charge conversion layer is alleviated, and degradation of the charge conversion layer can be suppressed.

Moreover, the intermediary layer, which raises joining force between the extended electrode portion and the substrate, is formed extending from between the charge conversion layer and the upper electrode portion to between the extended electrode portion and the substrate. Thus, in comparison with a structure in which a member that raises joining force between an extended electrode portion and a substrate is embedded under a charge conversion layer from between the extended electrode portion and the substrate, creeping discharges from the extended electrode portion to the lower electrode can be suppressed, and insulation with respect to the lower electrode portion provided under the charge conversion layer can be assured.

The electrode layer of the radiation detector of the present invention may be formed with gold (Au), and the substrate may be formed with a glass.

According to this structure, in view of the materials of the electrode layer and the substrate, adhesion of the extended electrode portion to the substrate is poor. However, because the intermediary layer raises joining force between the extended electrode portion and the substrate, peeling between the extended electrode portion and the substrate can be suppressed.

The intermediary layer of the radiation detector of the present invention may be formed with antimony sulfide ($Sb_2S_3$).

In the radiation detector of the present invention, a minimum separation between a portion of the extended electrode portion that is formed on the substrate and the lower electrode portion may be at least 0.5 mm per 1 kV of a voltage that is to be applied from the wiring to the extended electrode portion.

According to this structure, intra-plane discharges from the extended electrode portion to the lower electrode are further suppressed, and insulation with respect to the lower electrode portion provided under the charge conversion layer can be further assured.

With the structures described above, the present invention can both suppress degradation of the charge conversion layer and assure insulation with respect to the lower electrode portion provided under the charge conversion layer.

DETAILED DESCRIPTION OF THE INVENTION

Herebelow, an example of an embodiment of the radiation detector relating to the present invention will be described on the basis of the drawings.

The radiation detector relating to the present embodiment is to be employed at an X-ray photography device or the like. The radiation detector is equipped with an electrostatic recording portion, which includes a light conduction layer that expresses conductivity consequent to irradiation of radiation rays being received. The radiation detector senses irradiation of radiation rays carrying image information and records the image information, and outputs an image signal representing the recorded image information.

The radiation detector may be: a "light-reading system" radiation detector, which reads using a semiconductor material that generates charge in accordance with irradiation of light; a radiation detector of a system that reads by thin film transistors (TFT) or the like collecting charges generated by the irradiation of radiation rays and the collected charges turning electronic switches of the thin film transistors on and off in individual pixel units (hereafter referred to as a TFT system); or the like.

—Structure of TFT System Radiation Detector—

Figure 1:
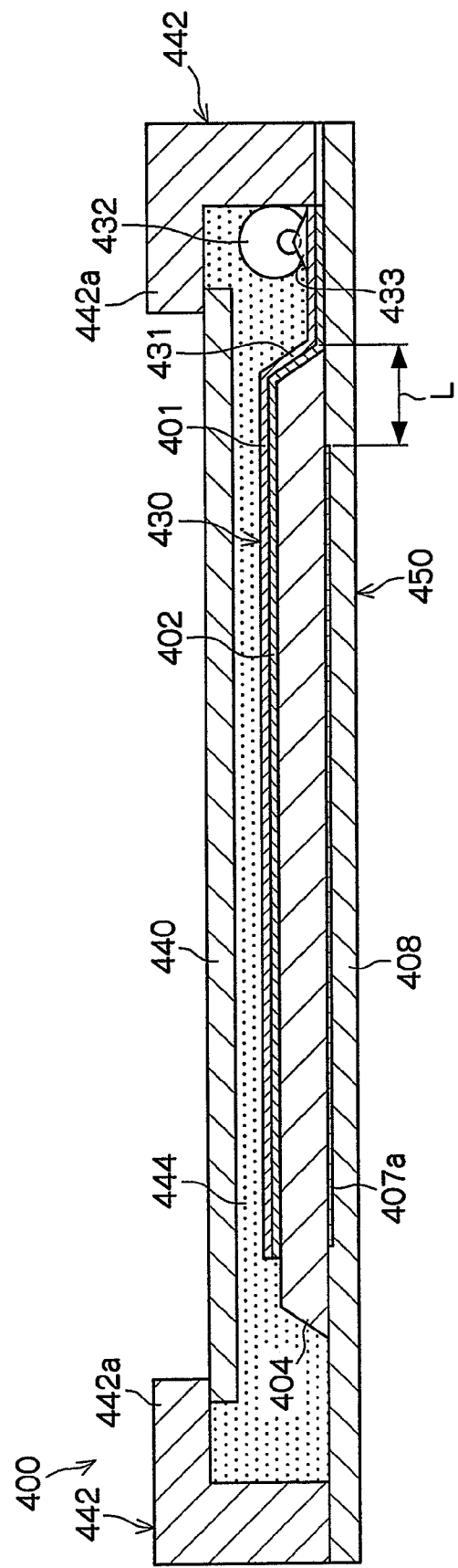
FIG. 1 is a schematic view showing overall structure of a TFT system radiation detector.
Figure 2:
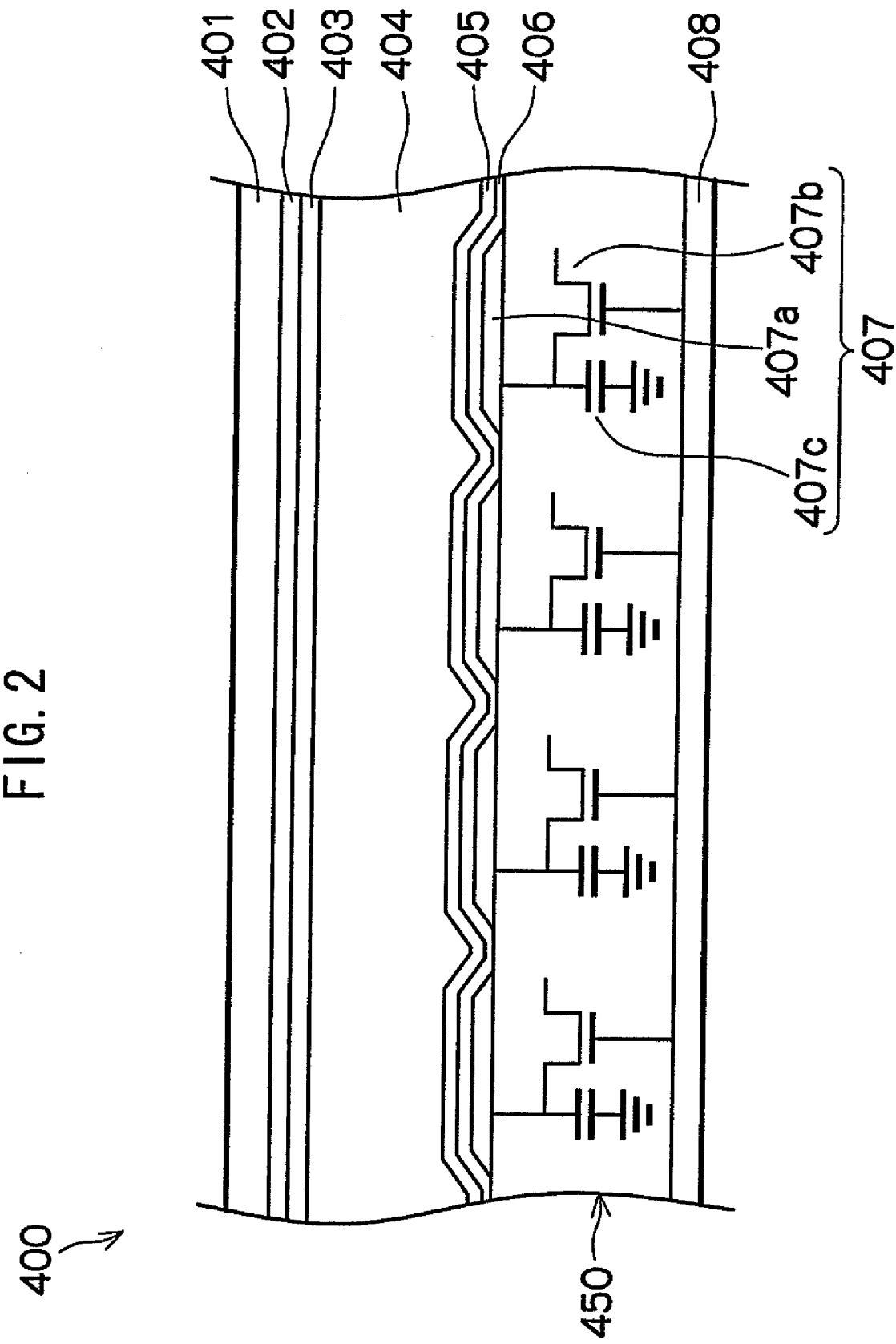
FIG. 2 is a schematic structural view showing principal elements of the TFT system radiation detector.

First, a TFT system radiation detector will be described. FIG. 1 is a schematic diagram showing overall structure of the TFT system radiation detector. FIG. 2 is a diagram showing structure of principal elements of the radiation detector, and shows portions which are laminated on a glass substrate.

A radiation detector 400 relating to the present embodiment, as shown in FIG. 1 and FIG. 2, is provided with a light conduction layer 404, which expresses conductivity for electromagnetic waves, to serve as a charge conversion layer that generates charge when X-rays, which are the radiation, are incident in a state in which a bias voltage is applied. As the light conduction layer 404, a non-crystalline (amorphous) material which has a high dark resistance, shows excellent electromagnetic wave conductivity with respect to X-ray irradiation, and can be formed into large-area films at low temperature by a vacuum vapor deposition method is preferable. An amorphous Se (a-Se) film is used. Further, materials in which amorphous Se is doped with As, Sb or Ge have excellent thermal stability, and are excellent materials.

A single bias electrode 401 is laminated onto the light conduction layer 404 to serve as an upper electrode portion for applying bias voltage to the light conduction layer 404. An electrode layer 430 is structured by this bias electrode 401 and an extended electrode portion 431, which will be described later. As an example, gold (Au) is used at the bias electrode 401.

A plurality of charge collection electrodes 407a, which serve as a lower electrode portion, are formed under the light conduction layer 404. Each charge collection electrode 407a, as shown in FIG. 2, is connected to a respective charge collection capacitance 407c and a switch element 407b.

An intermediary layer is also provided, between the light conduction layer 404 and the bias electrode 401. The intermediary layer is a layer which is interposed between the upper electrode and the charge conversion layer, and may be combined with a charge injection blocking layer (which includes charge accumulation and a diode form). The charge injection blocking layer is a resistive layer or an insulative layer, or a hole injection blocking layer that blocks injection of holes while being conductive for electrons, an electron injection blocking layer that blocks injection of electrons while being conductive for holes, or the like. $CeO_2$, $ZnS$ or $Sb_2S_3$ may be used as a hole injection blocking layer. Of these, $ZnS$ can be formed at low temperatures and is preferable. An electron injection blocking layer may be Se, CdTe or an organic-type compound, doped with $Sb_2S_3$, CdS or Te, or the like. Here, a hole injection blocking layer and an electron injection blocking layer can both be formed depending on locations at which $Sb_2S_3$ is provided. In the present embodiment, because the bias voltage is positive, a hole injection blocking layer 402 is provided as the intermediary layer. Further, an electron injection blocking layer 406, which is not the intermediary layer of the present invention, is provided between the light conduction layer 404 and the charge collection electrode 407a.

Crystallization prevention layers 403 and 405 are provided between the hole injection blocking layer 402 and the light conduction layer 404 and between the electron injection blocking layer 406 and the light conduction layer 404, respectively. As the crystallization prevention layers 403 and 405, it is possible to use GeSe, $GeSe_2$, $Sb_2Se_3$ or a-$As_2Se_3$, or compounds based on Se—As, Se—Ge or Se—Sb, or the like.

A charge sensing layer 407 is formed by the charge collection electrodes 407a, the switch elements 407b and the charge collection capacitances 407c. An active matrix substrate 450 is structured by a glass substrate 408 and the charge sensing layer 407.

Figure 3:
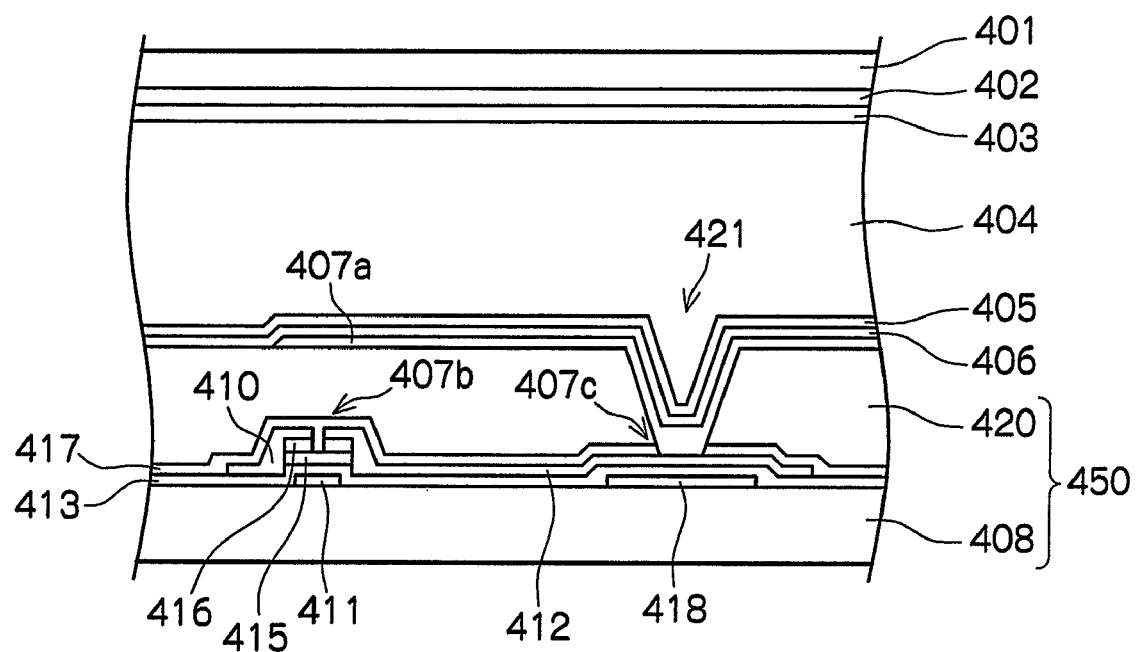
FIG. 3 is a sectional view showing structure of a one-pixel unit of the TFT system radiation detector.
Figure 4:
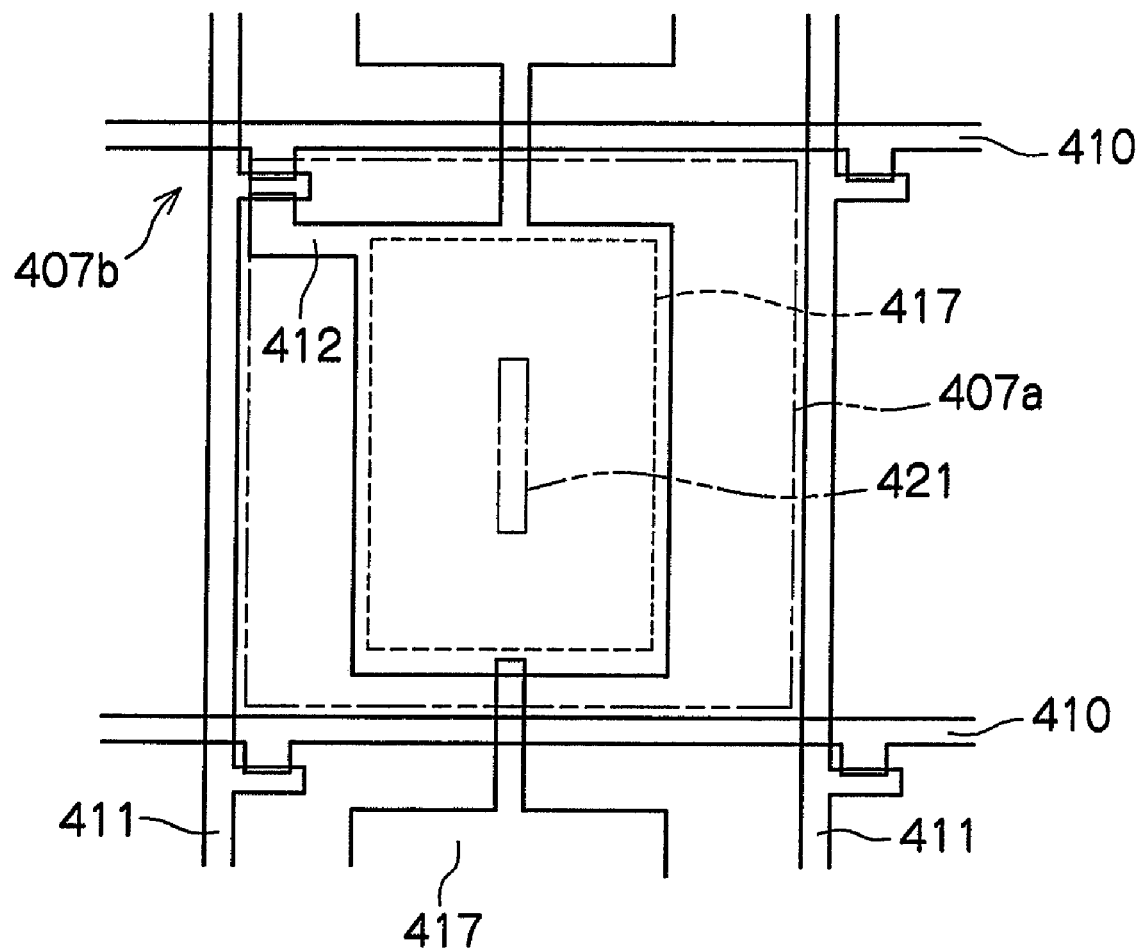
FIG. 4 is a plan view showing structure of the one-pixel unit of the TFT system radiation detector.

FIG. 3 is a sectional view showing a constitution of a single pixel unit of the radiation detector 400, and FIG. 4 is a plan view of the same. A size of the single pixel shown in FIG. 3 and FIG. 4 is of the order of 0.1 mm×0.1 mm to 0.3 mm×0.3 mm. For the whole radiation detector, these pixels are arrayed in a matrix of around 500×500 to 3000×3000 pixels.

As shown in FIG. 3, the active matrix substrate 450 includes the glass substrate 408, a gate electrode 411, a charge collection capacitance electrode (below referred to as a Cs electrode) 418, a gate insulation film 413, a drain electrode 412, a channel layer 415, a contact electrode 416, a source electrode 410, an insulation protection film 417, an interlayer insulation film 420, and the charge collection electrode 407a.

The switch element 407b formed of a thin film transistor (TFT) is structured by the gate electrode 411, the gate insulation film 413, the source electrode 410, the drain electrode 412, the channel layer 415 and the contact electrode 416, or the like. The charge collection capacitance 407c is structured by the Cs electrode 418, the gate insulation film 413 and the drain electrode 412, or the like.

The glass substrate 408 is a support substrate. As the glass substrate 408, it is possible to use, for example, a non-alkaline glass substrate (for example, CORNING 1737 or the like). As shown in FIG. 4, the gate electrodes 411 and source electrodes 410 are electrode wires arranged in a checkerboard pattern. The switch elements 407b formed by thin film transistors (hereafter referred to as TFTs) are formed at intersections of the gate electrodes 411 and source electrodes 410.

The source and drain of the switch element 407b are connected to the source electrode 410 and the drain electrode 412, respectively. The source electrode 410 is provided with a linear portion, which serves as a signal line, and an extended portion for structuring the switch element 407b. The drain electrode 412 is provided so as to join the switch element 407b with the charge collection capacitance 407c.

The gate insulation film 413 is formed of $SiN_x$, $SiO_x$ or the like. The gate insulation film 413 is provided so as to cover the gate electrode 411 and the Cs electrode 418. A portion that is disposed over the gate electrode 411 acts as a gate insulation film of the switch element 407b, and a portion that is disposed over the Cs electrode 418 acts as a dielectric layer of the charge collection capacitance 407c. That is, the charge collection capacitance 407c is formed by a superposed region of the drain electrode 412 with the Cs electrode 418, which is formed in the same layer as the gate electrode 411. The gate insulation film 413 is not limited to $SiN_x$, $SiO_x$ or the like, and may be combined with an anodization film which anodizes the gate electrode 411 and the Cs electrode 418.

The channel layer (i layer) 415 is a channel portion of the switch element 407b, and is a path for current between the source electrode 410 and the drain electrode 412. The contact electrode (n+ layer) 416 enables contact between the source electrode 410 and the drain electrode 412.

The insulation protection film 417 is formed over substantially a whole area (substantially a whole region) of the source electrode 410 and the drain electrode 412, which is to say, over the glass substrate 408. Thus, the insulation protection film 417 protects the drain electrode 412 and the source electrode 410, and achieves electrical insulation and separation. The insulation protection film 417 includes a contact hole 421 which is formed at a predetermined position thereof, that is, at a position disposed over a portion that opposes the Cs electrode 418 of the drain electrode 412.

The charge collection electrode 407a is formed of a non-crystalline transparent conductive oxide film. The charge collection electrode 407a is formed such that the contact hole 421 is dug therein, and is laminated over the source electrode 410 and the drain electrode 412. The charge collection electrode 407a and the light conduction layer 404 are electrically conductive, and charge generated at the light conduction layer 404 can be gathered by the charge collection electrode 407a.

The interlayer insulation film 420 is formed of an acrylic resin featuring photosensitivity, and achieves electrical insulation and separation from the switch element 407b. The contact hole 421 penetrates through the interlayer insulation film 420, and the charge collection electrode 407a is connected with the drain electrode 412. The contact hole 421 is formed with an inverted tapering form, as shown in FIG. 3.

A high voltage power source is connected between the bias electrode 401 and the Cs electrode 418. A structure in which a high voltage line 432, which is connected to the high voltage power source, is electrically connected with the bias electrode 401 will be described below.

A voltage is applied between the bias electrode 401 and the Cs electrode 418 by this high voltage power source. As a result, an electric field can be generated between the bias electrode 401 and the charge collection electrode 407a, via the charge collection capacitance 407c. At this time, the light conduction layer 404 and the charge collection capacitance 407c act as structures which are electrically connected in series. Thus, while the bias voltage is kept applied to the bias electrode 401, charges (electron-hole pairs) are generated in the light conduction layer 404. The electrons generated in the light conduction layer 404 migrate to the positive electrode side and the holes migrate to the negative electrode side. Hence, charge is collected in the charge collection capacitance 407c.

As the overall radiation detector, the charge collection electrodes 407a are plurally arrayed in one or two dimensions, and the charge collection capacitances 407c, which are individually connected to the charge collection electrodes 407a, and the switch elements 407b, which are individually connected to the charge collection capacitances 407c, are plurally provided. Thus, it is possible to temporarily accumulate electromagnetic wave information in one dimension or two dimensions at the charge collection capacitances 407c, and by scanning the switch elements 407b in sequence, to read out charge information in one dimension or two dimensions with ease.

—Principles of Operation of TFT System Radiation Detector—

Next, principles of operation of the TFT system radiation detector 400 described above will be described. In the state in which voltage is applied between the bias electrode 401 and the Cs electrode 418, which is to say, the state in which voltage is applied to the bias electrode 401 and the light conduction layer 404 via the Cs electrode 418, when X-rays are irradiated at the light conduction layer 404, charges (electron-hole pairs) are generated in the light conduction layer 404. Then, because the light conduction layer 404 and the charge collection capacitance 407c form structures which are electrically connected in series, the electrons generated in the light conduction layer 404 migrate to the positive electrode side and the holes migrate to the negative electrode side, and as a result, charge is collected in the charge collection capacitance 407c.

The charge collected in the charge collection capacitance 407c can be taken out to the outside through the source electrode 410 when the switch element 407b is turned on by an input signal to the gate electrode 411. Thus, because the electrode lines constituted by the gate electrodes 411 and the source electrodes 410, and the switch elements 407b and the charge collection capacitances 407c are all provided in a matrix form, signals inputted to the gate electrodes 411 are sequentially scanned, and signals from the source electrodes 410 are sensed at each source electrode 410. Thus, it is possible to obtain image information of the X-rays in two dimensions.

Next, details of the charge collection electrode 407a will be described. The charge collection electrode 407a that is used in the present embodiment is structured by a non-crystalline transparent conductive oxide film. As a non-crystalline transparent conductive oxide film material, it is possible to employ a compound of indium and tin (ITO, indium tin oxide), a compound of indium and zinc (IZO, indium zinc oxide), a compound of indium and germanium (IGO, indium germanium oxide) or the like as a basic composition.

As a charge collection electrode, various metallic films and conductive oxide films can be employed. However, for the following reason, a transparent conductive oxide film of ITO (indium tin oxide) or the like will often be used. In a case in which input X-ray quantities at the radiation detector are large, unnecessary charges may be captured in a semiconductor film (or close to a boundary face between the semiconductor film and an adjoining layer). Such residual charges are memorized long-term, and tend to migrate as time passes. Thus, X-ray detection characteristics at subsequent times of image detection deteriorate and residual images (ghost images) appear, which are problems. Accordingly, Japanese Patent Application Laid-Open (JP-A) No. 9-9153 (corresponding to U.S. Pat. No. 5,563,421) discloses a method in which, when residual charge has been generated in a light conduction layer, the residual charge is excited and eliminated by irradiation of light from an outer side of the light conduction layer. In such a case, in order to efficiently irradiate light from the lower side (the charge collection electrode side) of the light conduction layer, it is necessary that the charge collection electrode be transparent with respect to the irradiated light. Moreover, for the objective of increasing a surface area occupancy ratio (fill factor) of the charge collection electrodes and/or for the objective of shielding switch elements, it is desirable to form the charge collection electrode so as to cover the switch element. However, if the charge collection electrode is non-transparent, it is not possible to inspect the switch element after formation of the charge collection electrode.

For example, if an inspection of characteristics of the switch elements is performed after formation of the charge collection electrodes, then if the switch elements are covered by non-transparent charge collection electrodes, when a failure in characteristics of the switch elements is found, it is not possible to inspect the switch elements with an optical microscope or the like in order to determine a cause of the failure. Therefore, it is desirable that the charge collection electrodes be transparent such that the switch elements can be easily inspected after formation of the charge collection electrodes.

—Structure Electrically Connecting Bias Electrode with High Voltage Line—

Figure 5:
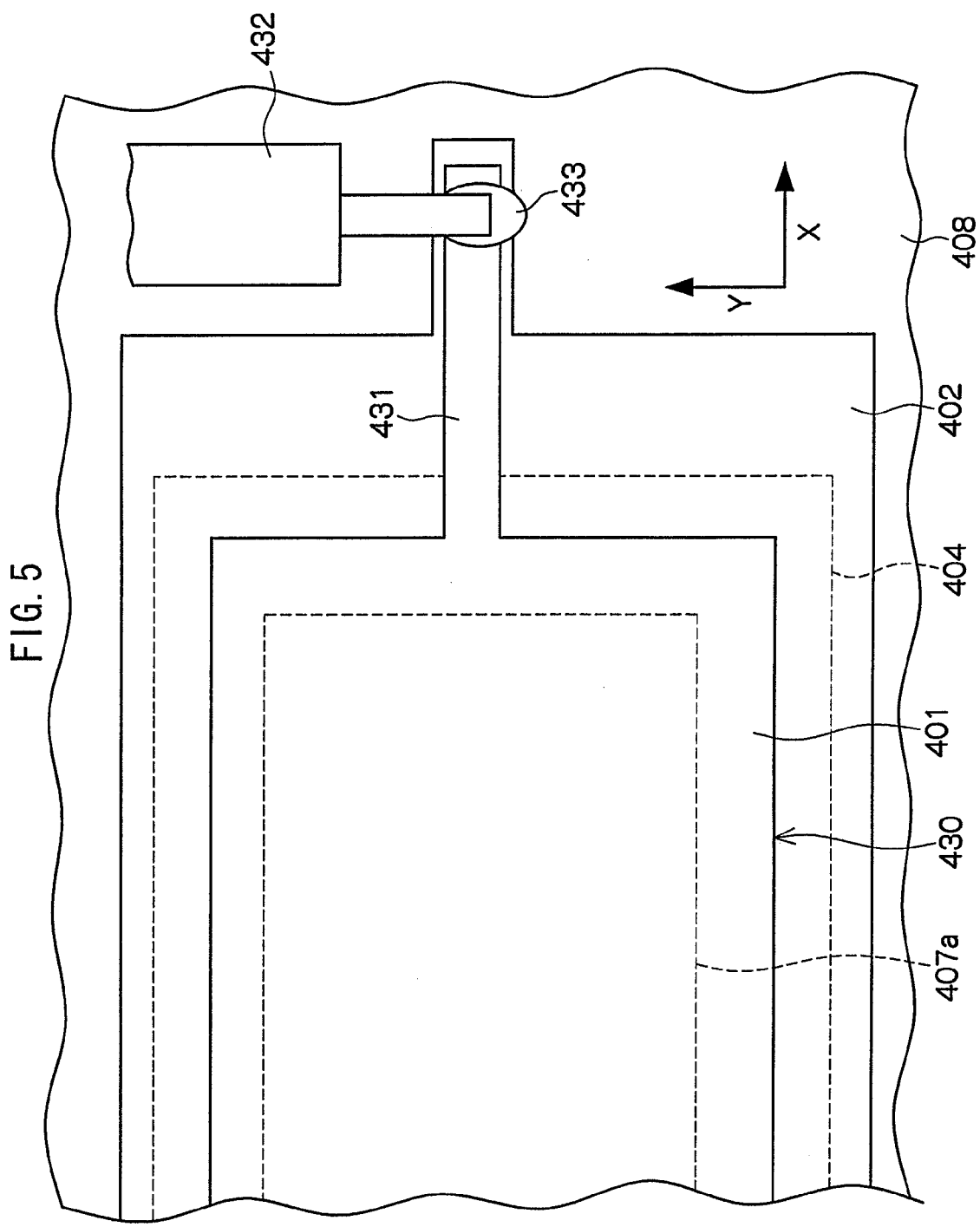
FIG. 5 is a schematic plan view showing a connection portion of the TFT system radiation detector, at which an extended electrode portion and a high voltage line are connected.

Now, a structure in the TFT system radiation detector 400 described above that electrically connects the bias electrode 401 with the high voltage line 432 will be described. FIG. 5 is a schematic plan view showing a connection portion at which the extended electrode portion 431 and the high voltage line 432 are connected.

As shown in FIG. 1, the extended electrode portion 431 is formed to be extended from the bias electrode 401 down the side face of the light conduction layer 404 to a region on the glass substrate 408 at which the light conduction layer 404 is absent. This extended electrode portion 431 and the bias electrode 401 structure the electrode layer 430, and are integrally formed by the same process steps.

As shown in FIG. 5, the extended electrode portion 431 protrudes from a side portion of the bias electrode 401, and as shown in FIG. 1, the extended electrode portion 431 runs along a side face of the light conduction layer 404, with a downward-angled descending gradient, and is led down to the glass substrate 408 at a lowermost portion of the radiation detector 400.

A width of the extended electrode portion 431 in a direction (direction Y in FIG. 5) intersecting the direction of extension thereof (direction X in FIG. 5) is formed to be narrower than the bias electrode 401. Therefore, material for forming the electrode layer 430 can be reduced. Herein, the width of the extended electrode portion 431 may be the same as a width of the bias electrode 401, and may be formed to be narrower than the bias electrode 401.

The hole injection blocking layer 402 is formed extending from between the light conduction layer 404 and the bias electrode 401 to between the extended electrode portion 431 and the glass substrate 408, and extends to the region on the glass substrate 408 at which the light conduction layer 404 is not present.

Moreover, the hole injection blocking layer 402 is formed on the glass substrate 408, and is used as a foundation for joining the extended electrode portion 431 to the glass substrate 408. As the hole injection blocking layer 402, a material with which adhesion between the hole injection blocking layer 402 and the glass substrate 408 and adhesion between the hole injection blocking layer 402 and the extended electrode portion 431 are higher than adhesion between the extended electrode portion 431 and the glass substrate 408 will be selected.

Thus, because the hole injection blocking layer 402 of which adhesion with respect to the glass substrate 408 and the extended electrode portion 431 is higher than adhesion of the extended electrode portion 431 to the glass substrate 408 is used as a foundation, joining force between the extended electrode portion 431 and the glass substrate 408 is raised.

The extended electrode portion 431 is electrically connected, at the region on the glass substrate 408 without the light conduction layer 404, with the high voltage line 432, which serves as wiring for applying the bias voltage through the extended electrode portion 431 to the light conduction layer 404 via the bias electrode 401.

The high voltage line 432 is guided in from outside, and is electrically connected with a distal end portion of the extended electrode portion 431 by a conductive paste 433.

A minimum separation L between a portion of the extended electrode portion 431 that is formed on the glass substrate 408 and the charge collection electrode 407a (see FIG. 1) is set to at least 0.5 mm per 1 kV of voltage applied from the high voltage line 432 to the extended electrode portion 431. For example, if a voltage of 10 kV is to be applied from the high voltage line 432 to the extended electrode portion 431, the minimum separation L is 5 mm.

Now, an example of steps for fabrication of the electrode layer 430, which is formed of the bias electrode 401 and the extended electrode portion 431, and the hole injection blocking layer 402 will be described.

First, the electron injection blocking layer 406 is formed on the active matrix substrate 450. The electron injection blocking layer 406 is formed of antimony sulfide ($Sb_2S_3$) with a film thickness of 2 µm. Then, a film of Se precursor is formed by vapor deposition, and the light conduction layer 404 is formed. The light conduction layer 404 is formed of non-crystalline Se with a film thickness of 1000 µm. Then, the hole injection blocking layer 402 is formed on the light conduction layer 404. The hole injection blocking layer 402 is formed of antimony sulfide (Sb$_2$S$_3$) with a film thickness of 0.3 μm. Then, a film of Au is formed by vapor deposition, and the crystallization prevention layer 403 is formed. The crystallization prevention layer 403 is formed of the bias electrode 401 and the extended electrode portion 431, with a film thickness of 0.1 μm.

—Structure Covering the Light Conduction Layer—

Next, a structure covering the light conduction layer 404 will be described. As shown in FIG. 1, a cover glass 440 is provided over the bias electrode 401 to serve as a cover member which covers the bias electrode 401.

A protective member 442, to which the cover glass 440 is joined, is provided at the glass substrate 408. The protective member 442 is formed in a box shape overall, of which a top portion and a bottom portion are opened. Side walls of the protective member 442 are provided standing at outer peripheral portions of the glass substrate 408, and surround a periphery of the light conduction layer 404. An upper portion of the protective member 442 forms a flange portion 442a which extends toward a side above a central portion of the glass substrate 408. Thus, the protective member 442 is formed in an 'L' shape in cross section. An upper face of the cover glass 440 is joined to a lower face (inner wall) of the flange portion 442a. Thus, regions of joining between the protective member 442 and the cover glass 440 are disposed at the outer side of the light conduction layer 404. That is, the protective member 442 and the cover glass 440 are joined not over the light conduction layer 404 but at regions at which the light conduction layer 404 is not present on the glass substrate 408.

Herein, for example, polycarbonate, vinyl chloride, acrylic or PET is used as the protective member 442.

A space surrounding the cover glass 440, the protective member 442 and the glass substrate 408 is filled with a curable resin 444, which serves as a filler member. As the curable resin 444, for example, a room temperature-curable resin such as an epoxy, silicone or the like is used.

—Operational Effects of the TFT System Radiation Detector—

Next, operational effects of the TFT system radiation detector 400 described above will be described.

In the structure of the present embodiment, the extended electrode portion 431 is electrically connected with the high voltage line 432 at a region on the glass substrate 408 at which the light conduction layer 404 is not present, and a bias voltage is applied through the extended electrode portion 431 to the light conduction layer 404 via the bias electrode 401.

With a structure in which the high voltage line 432 is connected with the bias electrode 401 over the light conduction layer 404, depending on conditions during connection at a time of fabrication and at subsequent times of usage, the light conduction layer 404 which is a non-crystalline material may be compressed, which may lead to crystallization and degrade the light conduction layer 404.

Figure 6:
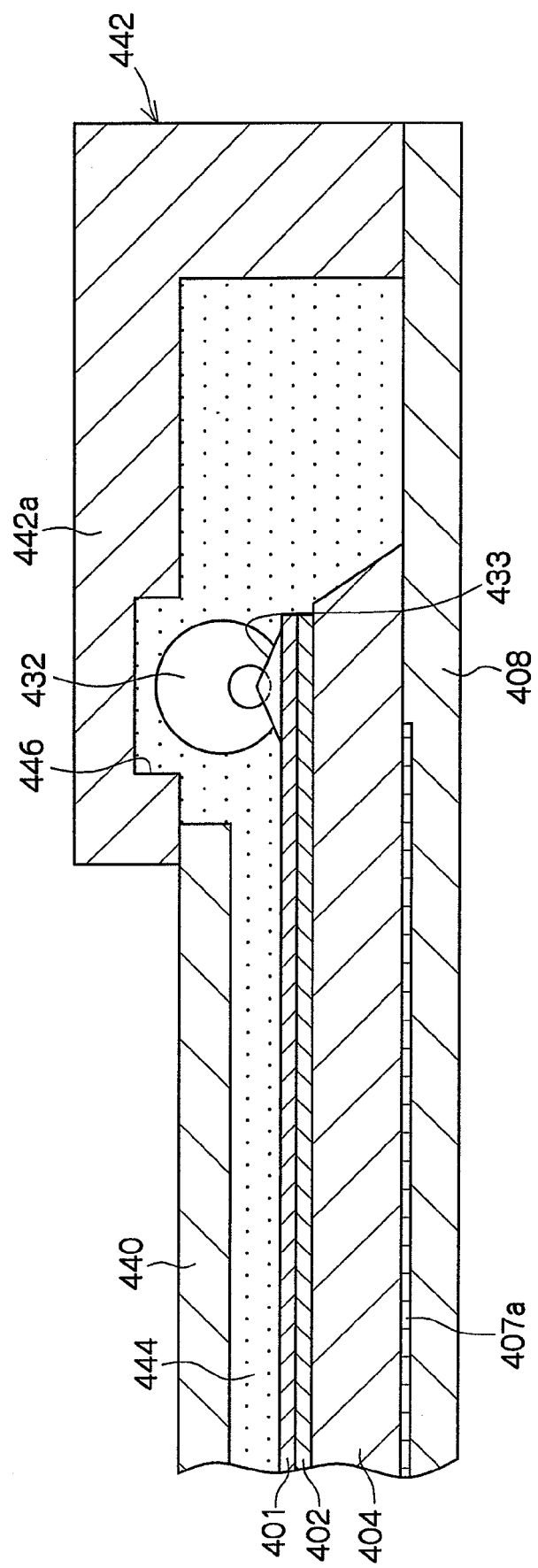
FIG. 6 is a schematic view showing structure of a TFT system radiation detector relating to a comparative example.

Further, in a structure in which the high voltage line 432 and the bias electrode 401 are connected over the light conduction layer 404, it may be necessary to form a space of at least an external diameter of the high voltage line 432 between the light conduction layer 404 and the cover glass 440. If this space are filled with the curable resin 444, a thickness of the curable resin 444 may be at least the external diameter of the high voltage line 432, and a charge conversion efficiency of the light conduction layer 404 may fall. Moreover, if the space between the light conduction layer 404 and the cover glass 440 is made narrower than the external diameter of the high voltage line 432 in order to suppress the reduction in the charge conversion efficiency of the light conduction layer 404, then it may be necessary to form an indentation 446 for accommodating the high voltage line 432 in the inner face of the protective member 442 to which the cover glass 440 is to be joined, as shown in FIG. 6. Accordingly, if the indentation 446 is formed, distributions of stress and strain may greatly increase depending on locations, due to variations in the surrounding environment (principally temperature) and differences between thermal expansion coefficients of the various members. In particular, damage can be caused to the light conduction layer 404 by stresses arising at the top of the light conduction layer 404, and problems with crystallization of the light conduction layer 404 which is a non-crystalline material, peeling between the respective layers and so forth can be caused.

By contrast, in the present embodiment, because the extended electrode portion 431 is electrically connected with the high voltage line 432 at the region on the glass substrate 408 at which there is none of the light conduction layer 404, pressures that are applied to the light conduction layer 404 are alleviated, and degradation of the light conduction layer 404 can be restrained. Moreover, it is possible to make the space between the light conduction layer 404 and the cover glass 440 narrower without forming the indentation 446 at the inner face of the protective member 442 or suchlike. Therefore, a charge conversion efficiency of the light conduction layer 404 does not fall and, even if the surrounding environment (principally temperature) varies, stresses on the light conduction layer 404 due to differences between the thermal expansion coefficients of the various members are ameliorated. Accordingly, crystallization of the light conduction layer 404 which is a non-crystalline material, peeling between the respective layers and so forth can be suppressed.

Furthermore, in the structure of the present embodiment, the hole injection blocking layer 402 is formed from between the light conduction layer 404 and the bias electrode 401 to between the extended electrode portion 431 and the glass substrate 408, and joining force between the extended electrode portion 431 and the glass substrate 408 is raised.

With a structure in which a member that raises joining force between the extended electrode portion 431 and the glass substrate 408 is formed on the glass substrate 408 beforehand, that member may form a structure which is embedded under the light conduction layer 404 from between the extended electrode portion 431 and the glass substrate 408. Consequently, if there is a gap between the light conduction layer 404 and the glass substrate 408, intra-plane discharges along the glass substrate 408 from the extended electrode portion 431 to the charge collection electrodes 407a may occur.

In the present embodiment, the hole injection blocking layer 402 is formed over the light conduction layer 404, passing from between the extended electrode portion 431 and the glass substrate 408 to between the light conduction layer 404 and the extended electrode portion 431. Therefore, even if there is a gap between the light conduction layer 404 and the glass substrate 408, intra-plane discharges from the extended electrode portion 431 to the charge collection electrode 407a can be suppressed, and insulation with respect to the charge collection electrodes 407a provided below the light conduction layer 404 can be assured.

Further, in a case in which Au or the like is used at the electrode layer 430, adhesiveness to the glass substrate 408 is poor. However, because the hole injection blocking layer 402 raises joining force between the extended electrode portion 431 and the glass substrate 408, peeling between the extended electrode portion 431 and the glass substrate 408 can be suppressed. Furthermore, because the hole injection blocking layer 402 is used, peeling can be suppressed with a previous layer structure, without forming a new member at the glass substrate 408 just in order to raise joining force between the extended electrode portion 431 and the glass substrate 408. Therefore, numbers of components and fabrication steps are not increased.

Further, in the present embodiment, because portions of joining between the cover glass 440 and the protective member 442 are disposed at the outer side of the light conduction layer 404, transmission of stresses generated at the portions of joining between the cover glass 440 and the protective member 442 to the light conduction layer 404 via the curable resin 444 is suppressed. Therefore, pressures that the light conduction layer 404 is subjected to are reduced, and degradation of the light conduction layer 404 can be suppressed.

Further, in the present embodiment, the minimum separation between a portion of the extended electrode portion 431 that is formed on the glass substrate 408 and the charge collection electrode 407a is at least 0.5 mm per 1 kV of a voltage applied from the high voltage line 432 to the extended electrode portion 431. Therefore, intra-plane discharges from the extended electrode portion 431 to the charge collection electrodes 407a are more reliably suppressed, and insulation with respect to the charge collection electrodes 407a provided below the light conduction layer 404 can be more reliably assured.

—Structure of Light-Reading System Radiation Detector—

Figure 7:
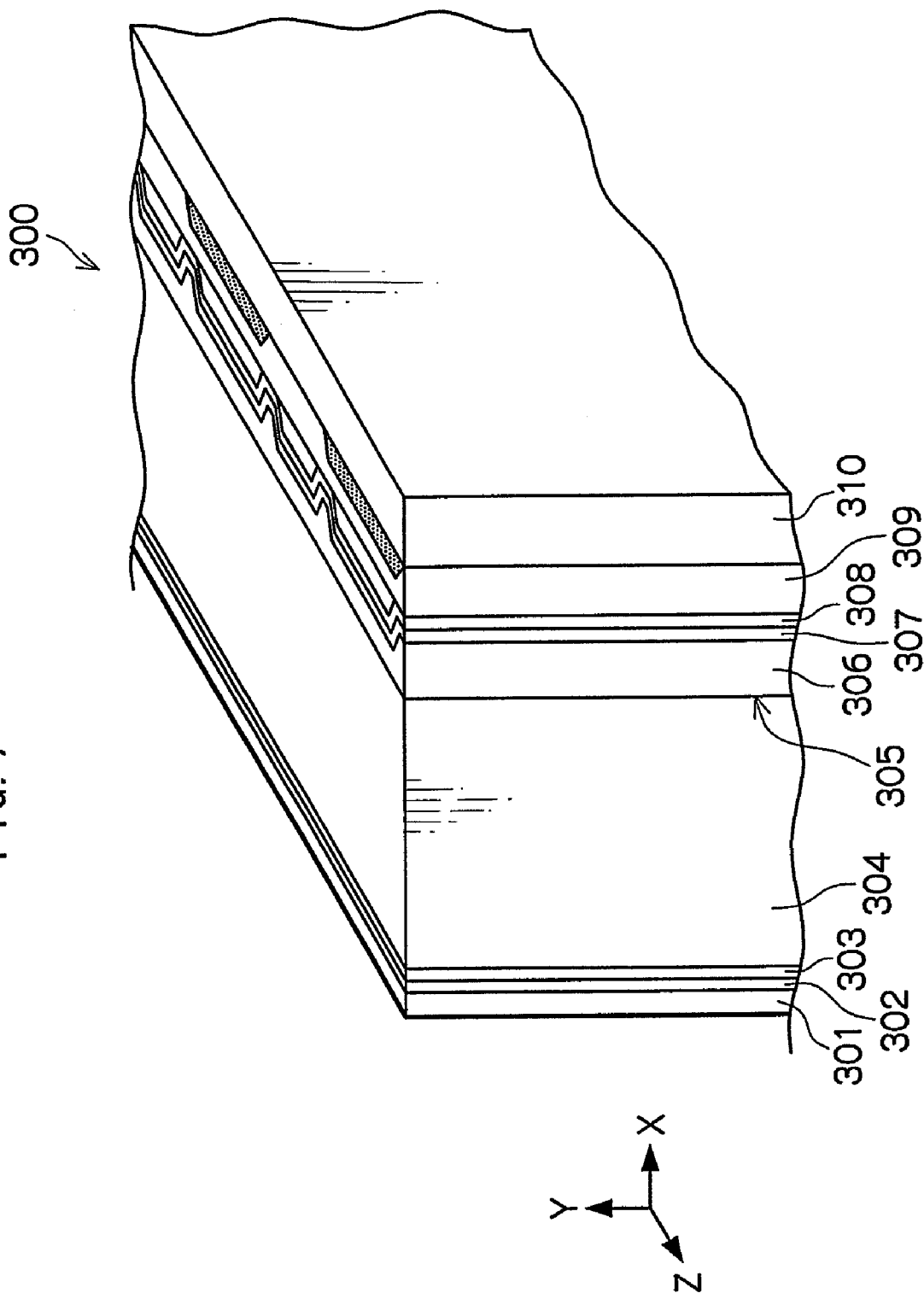
FIG. 7 is a perspective view showing schematic structure of a light-reading system radiation detector.
Figure 8:
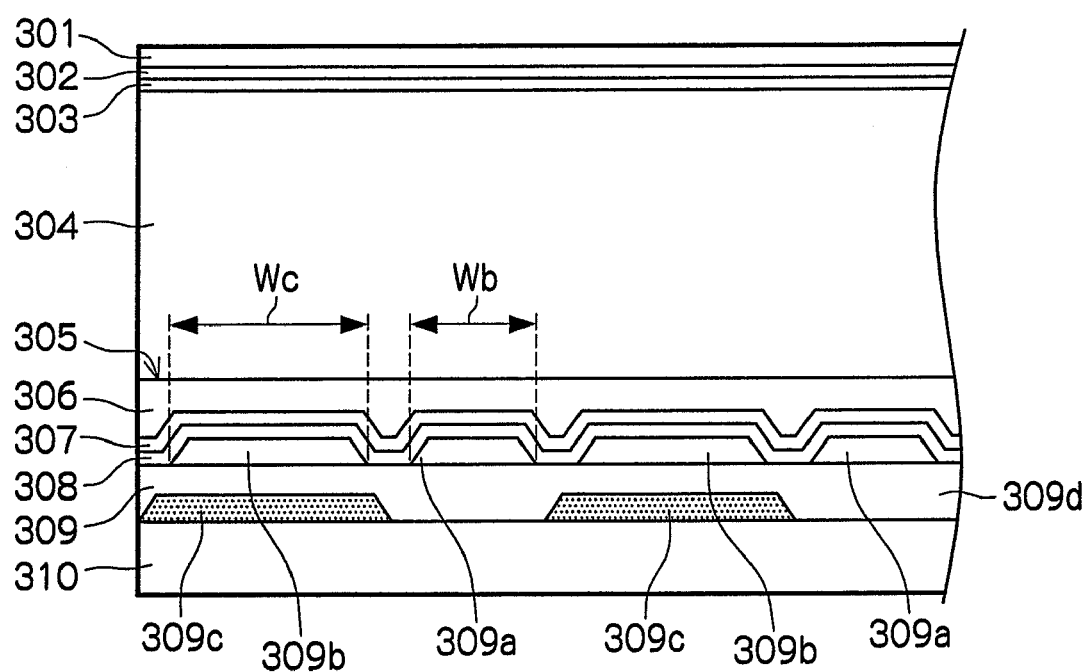
FIG. 8 is an XZ section view of the radiation detector of FIG. 7.
Figure 9:
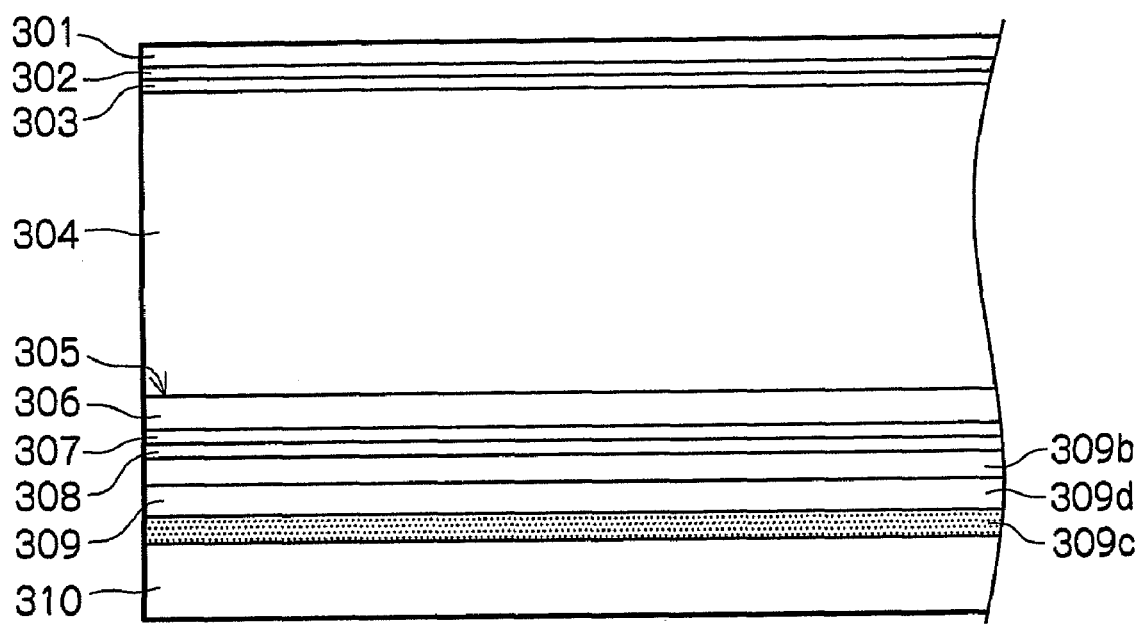
FIG. 9 is an XY section view of the radiation detector of FIG. 7.

Employment of the present invention is also possible for a light-reading system radiation detector. The present invention is employed on the basis of the above-described structure in which a bias electrode and a high voltage line are electrically connected and structure which covers a light conduction layer. Now, a light-reading system radiation detector will be described. FIG. 7 is a perspective view showing general structure of a light-reading system radiation detector 300, FIG. 8 is an XZ section view of the radiation detector 300, and FIG. 9 is an XY section view of the radiation detector 300.

The radiation detector 300 is formed by disposing a first electrode layer 301, a light conduction layer for recording 304, a light conduction layer for reading 306, a second electrode layer 309 and a glass substrate 310 in this order. The first electrode layer 301 features transparency to recording light which carries an image of radiation rays, such as X-rays or the like, which have passed through a subject. The light conduction layer for recording 304 generates charge pairs and expresses conductivity upon being subjected to irradiation of the recording light that has passed through the first electrode layer 301. The light conduction layer for reading 306 generates charge pairs and expresses conductivity upon being subjected to irradiation of reading light. The second electrode layer 309 is formed by first transparent linear electrodes 309a, second transparent linear electrodes 309b, a light blocking film 309c and an insulation layer 309d. The glass substrate 310 features transmissivity with respect to the reading light.

In the present embodiment, the first electrode layer 301 is a negative electrode. Therefore, a hole injection blocking layer 308 and an electron injection blocking layer 302 are included. The hole injection blocking layer 308 suppresses hole injection from the transparent linear electrodes 309a and 309b during application of a high voltage. The electron injection blocking layer 302 suppresses electron injection from the first electrode layer 301.

A crystallization prevention layer 303 and a crystallization prevention layer 307 are also included. The crystallization prevention layer 303, between the electron injection blocking layer 302 and the light conduction layer for recording 304, suppresses crystallization of the light conduction layer for recording 304. The crystallization prevention layer 307, between the hole injection blocking layer 308 and the light conduction layer for reading 306, suppresses crystallization of the light conduction layer for reading 306.

A two-dimensionally distributed charge storage section 305 is formed at a boundary face between the light conduction layer for recording 304 and the light conduction layer for reading 306. The charge storage section 305 stores latent image polarity charges which carry a radiation image that have been generated in the light conduction layer for recording 304.

A size (area) of the radiation detector 300 is at least, for example, 20 cm×20 cm. In particular, in a case of usage for chest X-ray photography, a useful size is of the order of 43 cm×43 cm.

As the hole injection blocking layer 308, $CeO_2$, ZnS and the like are available. Rather than just a single layer, laminating these in multiple layers is preferable for strengthening hole-blocking capability (for reducing a dark current). A thickness of the hole injection blocking layer 308 is desirably at least 20 nm and at most 100 nm.

The electron injection blocking layer 302 may be $Sb_2S_3$, an organic-type compound or the like. Rather than just a single layer, the electron injection blocking layer 302 may be laminated in multiple layers too.

As the crystallization prevention layers 303 and 307, it is most suitable to use a two-element system such as a compound based on Se—As, Se—Ge or Se—Sb, or the like, or a three-element system such as Se—Ge—Sb, Se—Ge—As, Se—Sb—As or the like.

As a material of the light conduction layer for recording 304, a light conductive material of which a-Se (amorphous selenium) is a principal component is most suitable.

As a material of the light conduction layer for reading 306, for example, a-Se doped with 10 to 200 ppm of Cl, in which a difference between a mobility of negative charges generated in the first electrode layer 301 and a mobility of positive charges which have the opposite polarity is large, or a light conductive material of which Se is a principal component, such as Se—Ge, Se—Sb, Se—As or the like, or the like will be excellent.

A thickness of the light conduction layer for recording 304 is preferably at least 50 μm and at most 1000 μm, in order to enable thorough absorption of electromagnetic waves for recording. A thickness of the light conduction layer for reading 306 is desirably no more than ½ of the thickness of the light conduction layer for recording 304. Furthermore, the thinner the thickness of the light conduction layer for reading 306, the more responsiveness at a time of reading is improved. Therefore, the thickness of the light conduction layer for reading 306 is preferably, for example, not more than 1/10 and more preferably not more than 1/100 or the like of the thickness of the light conduction layer for recording 304.

For materials of the respective layers, excellent examples are materials with which: negative charges are generated in the first electrode layer 301 and positive charges are generated in the transparent linear electrodes 309a and 309b of the second electrode layer 309; negative charges which serve as latent image polarity charges end up accumulated in the charge storage section 305 formed at the boundary face of the light conduction layer for recording 304 and the light conduction layer for reading 306; and the light conduction layer for reading 306 is caused to function as a "hole transport layer" in which a mobility of positive charges which serve as transport polarity charges is larger than a mobility of negative charges which serve as latent image polarity charges, the transport polarity charges being the opposite polarity to the latent image polarity charges. The respective charges may have the opposite polarities. Reversing the polarities thus may be implemented by small changes, such as changing the light conduction layer for reading that functions as a hole transport layer to a light conduction layer for reading that functions as an electron transport layer, and the like. Moreover, the light conduction layer for reading 306 may be provided as a layer of which a principal component is a-Se, and an $As_2Se_3$, GeSe, $GeSe_2$ or $Sb_2Se_3$ layer may be provided as the charge storage section 305.

For the first electrode layer 301 and the first transparent linear electrodes 309a, it is sufficient that the materials thereof feature transmissivity to the recording light and the reading light, respectively. In a case in which, for example, transmissivity with respect to visible light is to be provided, as a light-transmissive metallic thin film, it is possible to use a well-known metal oxide such as $SnO_2$, ITO (indium tin oxide), IZO (indium zinc oxide), IDIXO (indium X-metal oxide, (IDEMITSU KOSAN CO., LTD.)) which is an easily etched amorphous light-transmissive metal oxide, or the like, with around 50 to 200 nm thickness, preferably at least 100 nm. In a case of using X-rays as the recording light and irradiating X-rays from the first electrode layer 301 side to record a radiation image, because there is no need for the first electrode layer 301 to be transmissive with respect to visible light, the first electrode layer 301 may be formed using a pure metal such as, for example, Al, Au or the like with a thickness of 100 nm.

The first transparent linear electrodes 309a of the second electrode layer 309 are arranged in a stripe pattern at a pitch of pixels. The pixel pitch will be of the order of 50 to 250 μm for clinical X-ray photography, in order to maintain high sharpness while enabling a high SNR. Within this range of pixel pitches, a width of the first transparent linear electrodes 309a is of the order of 10 to 200 μm. Here, objectives of forming the electrodes of the second electrode layer 309 as stripe electrodes are to make compensation for structural noise easier, to improve the SNR of images by reducing capacitances, to implement parallel reading (principally in a main scanning direction) and enable a shortening of reading times, and the like.

The second transparent linear electrodes 309b are provided in the second electrode layer 309. The second transparent linear electrodes 309b are conductive members for outputting electronic signals at levels corresponding to amounts of latent image polarity charges that have been accumulated in the charge storage section 305 formed at the boundary face of the light conduction layer for recording 304 and the light conduction layer for reading 306. The second transparent linear electrodes 309b are arranged in a stripe pattern, and are arranged such that the second transparent linear electrodes 309b and the first transparent linear electrodes 309a are alternatingly disposed in parallel.

As the second transparent linear electrodes 309b, it is preferable to use the aforementioned light-transmissive metallic thin films. In such a case, it is possible to form patterns for the first transparent linear electrodes 309a and the second transparent linear electrodes 309b simultaneously with one lithography step. In this case, the light blocking film 309c is provided at regions on the glass substrate 310 that correspond to the second transparent linear electrodes 309b. The light blocking film 309c is formed of light-transmissivity disrupting members such that irradiation intensities of reading light onto the second transparent linear electrodes 309b will be smaller than irradiation intensities of the reading light onto the first transparent linear electrodes 309a. A transmissivity Pc of the light blocking film 309c with respect to the reading light is set to 10% or less, which is to say, light-blocking can be provided. Thus, charge pairs for image-reading can be generated in the light conduction layer for reading 306 in correspondence with the second transparent linear electrodes 309b.

Further, at the above-described first transparent linear electrodes 309a and second transparent linear electrodes 309b, the hole injection blocking layer 308 is formed thereon of a thin film of not more than 100 nm, and a predetermined separation is maintained such that the first transparent linear electrodes 309a and the second transparent linear electrodes 309b are electrically insulated.

In the radiation detector 300, a width Wc of the second transparent linear electrodes 309b is set wider than a width Wb of the first transparent linear electrodes 309a, and a transmissivity Prb of the first transparent linear electrodes 309a with respect to the reading light and a transmissivity Prc of the second transparent linear electrodes 309b with respect to the reading light are desirably set such that the condition (Wb×Prb)/(Wc×Prc)≧5 is satisfied. In this case, in accordance with the width Wc of the second transparent linear electrodes 309b being set wider than the width Wb of the first transparent linear electrodes 309a, the first transparent linear electrodes 309a and the second transparent linear electrodes 309b are both connected at a time of recording of an electrostatic latent image, and the second transparent linear electrodes 309b are actively utilized in formation of an electric field distribution.

When the first transparent linear electrodes 309a and the second transparent linear electrodes 309b are connected thus and recording is carried out, latent image polarity charges are accumulated not only at positions corresponding to the first transparent linear electrodes 309a but also at positions corresponding to the second transparent linear electrodes 309b. At a time of reading, when reading light is irradiated through the first transparent linear electrodes 309a onto the light conduction layer for reading 306, latent image polarity charges in portions above the first transparent linear electrodes 309a, which are each sandwiched by two of the second transparent linear electrodes 309b, are read out sequentially through the pairs of second transparent linear electrodes 309b. Thus, in this case, in the direction of arrangement of the first transparent linear electrodes 309a and second transparent linear electrodes 309b, a position corresponding to one of the first transparent linear electrodes 309a is a pixel center, and a single pixel which includes respective halves of the two second transparent linear electrodes 309b sandwiching the first transparent linear electrode 309a is formed.

Conductive members with better conductivity than the first transparent linear electrodes 309a and the second transparent linear electrodes 309b serve as bus lines, and are desirably provided extending along length directions of each of the first transparent linear electrodes 309a and each of the second transparent linear electrodes 309b.

The members of the light blocking film 309c need not necessarily be members featuring insulativity; members with which a specific resistance of the light blocking film 309c is at least $2×10^{-6}$ Ω·cm (and preferably not more than $1×10^{15}$ Ω·cm) can be used. For example, if the members are a metallic material, Al, Mo, Cr or the like can be used, and if the members are an inorganic material, $MoS_2$, $WSi_2$, TiN or the like can be used. Herein, it is more preferable to use members with which the specific resistance of the light blocking film 309c is at least 1 Ω·cm.

If members with conductivity, such as a metal material or the like, are used as the members of the light blocking film 309c, an insulator is disposed between the light blocking film 309c and the second transparent linear electrodes 309b in order to prevent direct contact between the two. In the radiation detector 300 of the present embodiment, the insulation layer 309d, which is formed of $SiO_2$ or the like, is provided between the light conduction layer for reading 306 and the glass substrate 310 to serve as an insulator. A thickness of this insulation layer 309d may be of the order of 0.01 to 10 μm.

When the light blocking film 309c is formed, if an irradiation intensity of the reading light onto the first transparent linear electrodes 309a is to be Ub and an irradiation intensity of the reading light onto the second transparent linear electrodes 309b is to be Uc, a thickness of the light blocking film 309c such that the condition $Ub/Uc \geq 5$ is satisfied is desirable. The right side of this condition will preferably be 8 and even more preferably 12.

If the gaps between the first transparent linear electrodes 309a and the second transparent linear electrodes 309b are set to Wbc, a width Wd of the light blocking film 309c such that the condition $Wc \leq Wd \leq (Wc+2 \times Wbc)$ is satisfied is desirable. This condition represents the light blocking film 309c completely covering at least the second transparent linear electrodes 309b, a reading light transmission portion of at least an extent corresponding to the width Wb of the first transparent linear electrodes 309a being assured, and the light blocking film 309c not covering portions corresponding to the first transparent linear electrodes 309a. However, light-blocking to an extent corresponding to the width Wc of the second transparent linear electrodes 309b may be insufficient, and a reading light transmission portion of an extent corresponding to the width Wb of the first transparent linear electrodes 309a may be insufficient for the reading light to reach the first transparent linear electrodes 309a. In consideration thereof, it is more preferable if $(Wc+Wbc/2) \leq Wd \leq (Wc+Wbc)$ is satisfied.

In the light-reading system radiation detector 300, the first electrode layer 301 corresponds to the upper electrode portion of the present invention and the light conduction layer for recording 304 corresponds to the charge conversion layer. The first transparent linear electrodes 309a and the second transparent linear electrodes 309b correspond to the lower electrode portion, and the glass substrate 310 corresponds to the substrate. The hole injection blocking layer 308 corresponds to the intermediary layer.

In the light-reading system radiation detector 300, similarly to the structure shown in FIG. 1, an extended electrode portion is formed extending from the first electrode layer 301 down a side face of the light conduction layer for recording 304 to a region on the glass substrate 310 at which the light conduction layer for recording 304 is not present. Further, the hole injection blocking layer 308 is formed from between the light conduction layer for recording 304 and the first electrode layer 301 to between the extended electrode portion and the glass substrate 310, and is utilized as a foundation for joining the extended electrode portion to the glass substrate 310.

Furthermore, a high voltage line, which serves as wiring for applying a bias voltage through the extended electrode portion to the light conduction layer for recording 304 via the first electrode layer 301, is electrically connected at the region on the glass substrate 310 at which the light conduction layer for recording 304 is not present.

The present invention is not to be limited to the embodiments described above; various modifications, changes and improvements will be possible.

What is claimed is:

1. A radiation detector comprising:
    a charge conversion layer that generates a charge consequent to incident radiation in a state in which a bias voltage is applied;
    a substrate that is provided below the charge conversion layer, the substrate including a lower electrode portion that collects the charge generated by the charge conversion layer;
    an electrode layer that includes
        an upper electrode portion that is laminated on the charge conversion layer and is for applying the bias voltage to the charge conversion layer, and
        an extended electrode portion that extends from the upper electrode portion down a side face of the charge conversion layer to a region on the substrate at which the charge conversion layer is not present;
    an intermediate layer that is formed continuously from between the charge conversion layer and the upper electrode portion to between the extended electrode portion and the substrate, the intermediate layer increasing adhesion between the extended electrode portion and the substrate; and
    wiring that is electrically connected with the extended electrode portion at the region on the substrate at which the charge conversion layer is not present, and that applies the bias voltage from the extended electrode portion to the charge conversion layer via the upper electrode portion;
    wherein
    an area of the intermediate layer is larger than an area of the charge conversion layer, and
    the area of the intermediate layer is larger than those of the upper electrode portion and the extended electrode portion.

2. The radiation detector of claim 1, wherein the electrode layer includes gold, and the substrate includes a glass.

3. The radiation detector of claim 2, wherein the intermediate layer includes antimony sulfide.

4. The radiation detector of claim 1, wherein a minimum separation between a portion of the extended electrode portion that is formed on the substrate and the lower electrode portion is at least 0.5 mm per 1 kV of a voltage that is to be applied from the wiring to the extended electrode portion.

5. The radiation detector of claim 1, wherein the intermediate layer is a hole-injection inhibition layer.

6. The radiation detector of claim 1, wherein the intermediate layer is in contact with the charge conversion layer along a top surface and a side surface of the charge conversion layer.

* * * * *